(12) United States Patent
Lee et al.

(10) Patent No.: US 6,181,843 B1
(45) Date of Patent: Jan. 30, 2001

(54) OPTICAL SWITCH OF SURFACE TRANSMISSION TYPE BY ONE-DIMENSIONAL ARRAY METHOD

(75) Inventors: Bun Lee; Jong Hyeob Baek, both of Daejon-Shi (KR)

(73) Assignee: Electronics and Telecommunications Research Institute, Daejon-Shi (KR)

(*) Notice: Under 35 U.S.C. 154(b), the term of this patent shall be extended for 0 days.

(21) Appl. No.: 09/145,512

(22) Filed: Sep. 2, 1998

(30) Foreign Application Priority Data

Dec. 24, 1997 (KR) .................................. 97-73709

(51) Int. Cl.$^7$ ...................................... G02B 6/26
(52) U.S. Cl. ................... 385/16; 385/17; 385/18
(58) Field of Search .................. 385/16–18; 359/128, 359/342

(56) References Cited

U.S. PATENT DOCUMENTS

| | | | |
|---|---|---|---|
| 5,572,540 | 11/1996 | Cheng | 372/50 |
| 5,706,383 | * 1/1998 | Malcuit et al. | 385/131 |
| 5,729,566 | * 3/1998 | Jewell | 372/96 |
| 5,822,352 | * 10/1998 | Mizutani et al. | 372/50 |

OTHER PUBLICATIONS

M. Grabherr, et al., High power top–surface emitting vertical–cavity lasers, Nov. 1996, pp. 203–204.

C. Mignosi et al., Dynamics of mode partitioning in vertical–cavity surface–emitting lasers, May 1997, pp. 270 to 271.

Tadashi Saitoh et al., Recent Progress in Semiconductor Laser Amplifiers, 1988, pp. 1656–1664.

* cited by examiner

*Primary Examiner*—Frank G. Font
*Assistant Examiner*—Armando Rodriguez
(74) *Attorney, Agent, or Firm*—Cohen, Pontani, Lieberman & Pavane

(57) ABSTRACT

The present invention is related to a surface transmission-type optical switch of the 1-D array method, and more particularly to a surface transmission-type optical switch, which is manufactured by Fabry-perot type not to need optical waveguides and integrated only by amplifiers of the space division multiplex. A surface transmission-type optical switch according to the present invention is a structure to overlap 3 optical amplifiers for optical switching, and an incoming signal beam is amplified through the first optical amplifier and becomes an n×n amplifiers of a matrix type with the second signal amplification, passing through the second optical amplifier overlapped on the first amplifier. Amplified signal beams through 2 amplifiers perform n×n matrix switching through the third amplifier, and go out to the opposite side of the incoming surface. Characteristics of a surface-type Fabry perot type structure is that selective amplification is possible, by selecting only one wavelength in multiple wavelengths as the gain bandwidth is 5 nm or less.

4 Claims, 4 Drawing Sheets

OPTICAL SWITCH OF SURFACE TRANSMISSION TYPE BY ONE-DIMENSIONAL ARRAY METHOD

BACKGROUND OF THE INVENTION

1. Field of the Invention

The present invention relates to an optical switch of surface transmission type of the one-dimensional array method, and more particularly to an optical switch of surface transmission type in the InAlGaAs circle, manufactured by a Fabry-Perot type which does not need an optical waveguide and integrated only by amplifiers of the space division multiplex.

2. Description of the Prior Art

Technology expected that switching speed will be fastest in the future depending on multiplex methods of optical switching is the space multiplexing, and its core technology is an optical switch that integration is possible and whose manufacturing process is simple. For the switch, it is intended to manufacture a matrix optical switch using a one-dimensional (1-D) surface transmission-type array of the space division multiplex. A matrix optical switch may apply to the time and wavelength division method in addition to the space division multiplex, and may be also utilized in parallel-type optical operation processing. The switch is very useful because it can execute functions of an optical amplifier and an optical filter at the same time and can select only one specific wavelength in the wavelength division method. Matrix optical switches commercialized now include semiconductor optical amplifier-type switches of a directional coupler type using a LiNbO3 substrate or a Mach-Zender interference type, but its element is too long or large and integration with other optical elements is difficult. Namely, an optical waveguide, created parallel along a thin film layer, is essential, and the configuration of an optical waveguide is a complicated type combined and divided like a cobweb. Also, an individual switch array on the optical waveguide is needed. Particularly, for n×n switches, 2n(n-1) switch arrays are generally needed. Therefore, if the value of n increases in a matrix, its practical use is restricted because geometrical combinations of so many elements are needed with optical waveguides, and due to large size. However, a surface transmission-type optical switch does not need a waveguide as a matrix type of a space division multiplex. Also, it can apply to the time and wavelength division multiplex and parallel optical operation processing is also possible, as the switch can perform functions of an optical amplifier and an optical filer.

SUMMARY OF THE INVENTION

Accordingly, the present invention is directed to provide a surface transmission-type optical switch that continuous optical amplification of the Fabry-Perot type is possible three times over optical amplifiers.

To achieve the above object, the present invention is characterized by comprising an indium substrate which incoming beams can be transmitted through; a lower superlattice Distributed Bragg Reflector (DBR) whose reflectance is 1; an optical amplifier of a Fabry-perot type, made of a top superlattice DBR with a rectangular or oval mesa surface of each different shape and size, compared with an active layer of a resonance mode thickness, which can generate only one resonance mode which is the same with an incoming wavelength, and circular shapes of incoming beams; and that an optical signal goes out to the above mesa surface using the surface-type optical amplification method that optical amplification is performed for the signal if an optical signal comes in from the lower part of the indium substrate.

It is to be understood that both the foregoing general description and the following detailed description are exemplary and explanatory and are intended to provide further explanation of the invention as claimed.

BRIEF DESCRIPTION OF THE DRAWINGS

The above object, other features and advantages of the present invention will become more apparent by describing the preferred embodiment thereof with reference to the accompanying drawings, in which.

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

Figure 1A:
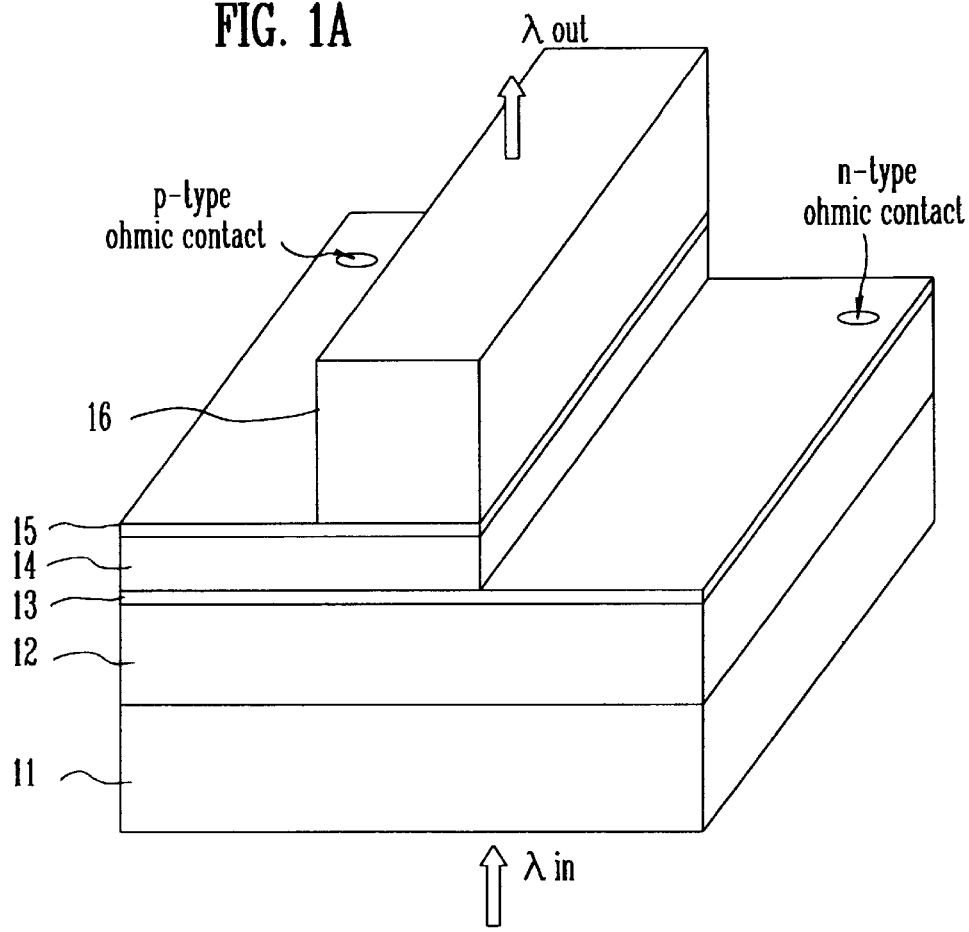
FIG. 1a shows a drawing to describe a surface transmission-type optical switch of the 1-D array method according to the present invention.

FIG. 1a, as a drawing to describe a surface transmission-type optical switch of a 1-D array method according to the present invention, is the structure of a surface-type optical amplifier of 1.55 micron band. A thin film structure is similar to the surface-type laser structure and an element is manufactured by once grown thin film by the MOCVD grown method.

Figure 1B:
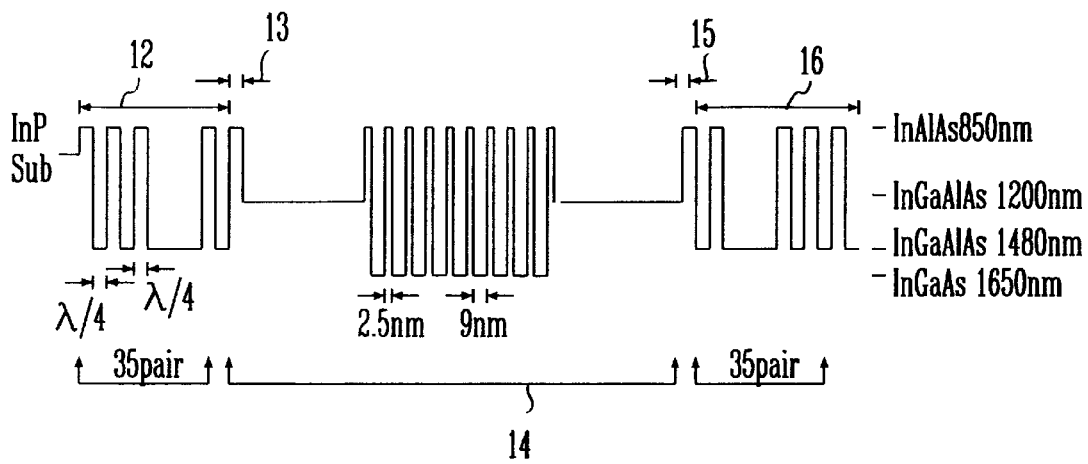
FIG. 1b shows a drawing to describe a conduction band diagram for a thin film structure of an optical amplifier.

FIG. 1b is a drawing to describe a conduction band diagram of a thin film structure of an optical amplifier. If reference is made to FIG. 1a and FIG. 1b, a laser thin film structure comprises 2 superlattice Distributed Bragg Reflectors (DBRs) on an InP substrate 11 and an active layer 14 with a single resonance layer between the reflectors. The lower DBRs 12 and 13 are made of 35 cycles by a pair of an InAlAs layer and an InGaAs layer, and the top DBRs 16 and 15 are made of 30 cycles by the same materials. The bandgap wavelength of an InAlGaAs layer of the DBR is 1,480 nm. The detailed thin film structure of an active layer 14 is a multilayer quantum-well structure of resonance transmission with 3 to 9 InAlAs barrier layers which are 2.5 nm thick and InGaAs quantum-well layer which are 9.0 nm thick. The cladding layer of a resonance layer has a bandgap of 12.0 nm and is adjusted so that thickness of the resonance layer is λ=1. To reduce serial resistance and to minimize free carrier absorption in a p-i-n diode structure, only the top layer 13 of the lower DBRs 12 and 13 is doped by the n-type, and only the lower layer 15 of the top DBR 15 and 16 is doped by the p-type. And all the other layers are not doped. The top DBRs 15 and 16 have a rectangular or long oval shape by mesa etching, and an ohmic metal film is added by exposing the p-type layer for the left side of the top DBR and the n-type layer for the right side. Signal beams come in from the lower part of a substrate and go out to the upper side after being amplified by obtaining gains in a quantum-well structure in a resonance layer.

Figure 2:
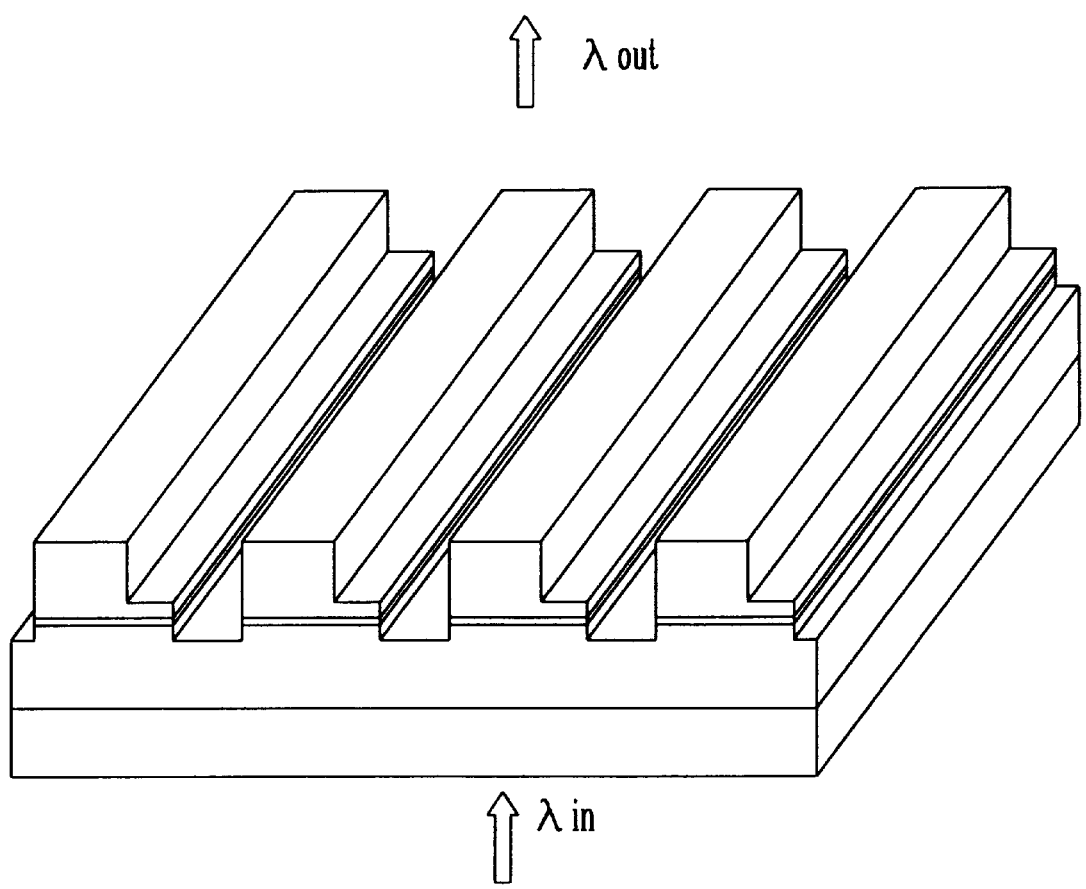
FIG. 2 shows a drawing to describe an optical amplifier of a 1-D array type according to the present invention.

FIG. 2, as an optical amplifier of a 1-D array type according to the present invention, shows that 4 optical amplifiers of FIG. 1 are arranged on one substrate in parallel. The ohmic connection method is the same with FIG. 1, and individual operation of each optical amplifier is possible. An ohmic metal contact layer is uniformly applied on the p-layer for the left side and the n-layer for the right side, centering on the rectangular mesa layer of an individual amplifying element. Circular signal beams to come in under a substrate are transmitted through the substrate, amplified in an Fabry-perot active layer and goes out to whole rectangular upper side of the mesa-etched epi layer. The shape of an etched epi layer may change into long oval shape instead of rectangular shape. A laser signal beam, coming in at the state to apply power less than oscillating critical current for the p-i-n diode of an individual element, goes out as a laser beam amplified by the same fabry-perot resonance mode. Then, if the beam is amplified weakly, the beam shape which comes out is to oscillate as a thin ring shape around the rectangle first rather than the central part of the mesa surface.

Figure 3:
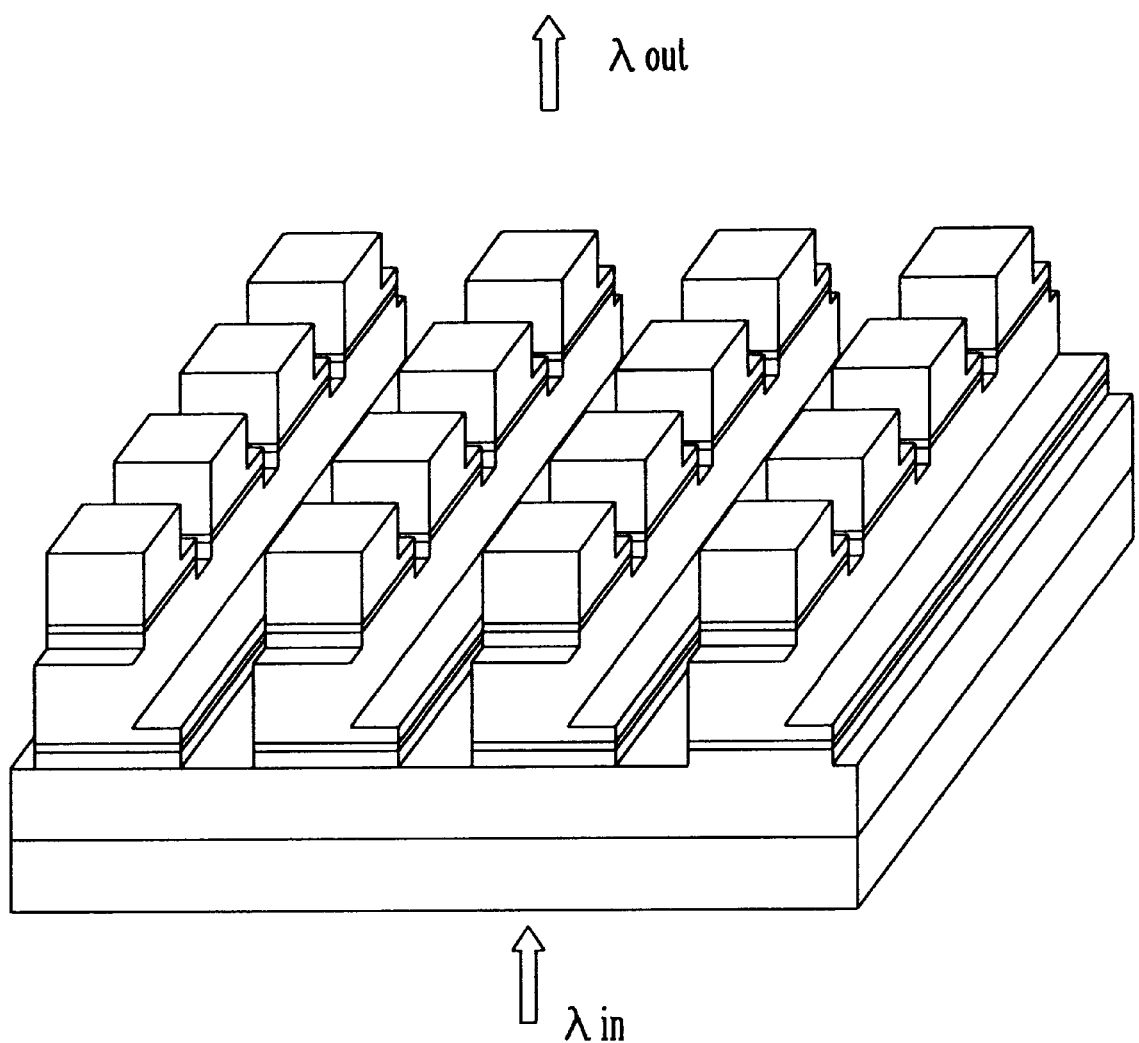
FIG. 3 shows a drawing to describe a 4×4 matrix optical amplifier according to the present invention.

FIG. 3 shows 4×4 matrix optical amplifiers according to the present invention. It is the structure to continuously grow optical amplifiers with the same structure on a thin film of the optical amplifier of FIG. 2 and to connect 2 amplifiers by serials. Making the amplifier on the second layer operate with the current less than a critical value that self oscillation is possible, the incoming laser beam by the rectangular mesa type through the amplifier of the first layer is amplified by the second same Fabry-perot resonance mode. The second amplified beam becomes 4×4 matrixes by a square mesa shape. Sixteen optical amplifiers are separated electrically and possible to operate. Though the rectangular beams amplified by the amplifier on the first layer go into a square amplifier on the second layer on the beams, amplification stops by the operating method and transmitted signal beam may be reduced, on the contrary.

Figure 4:
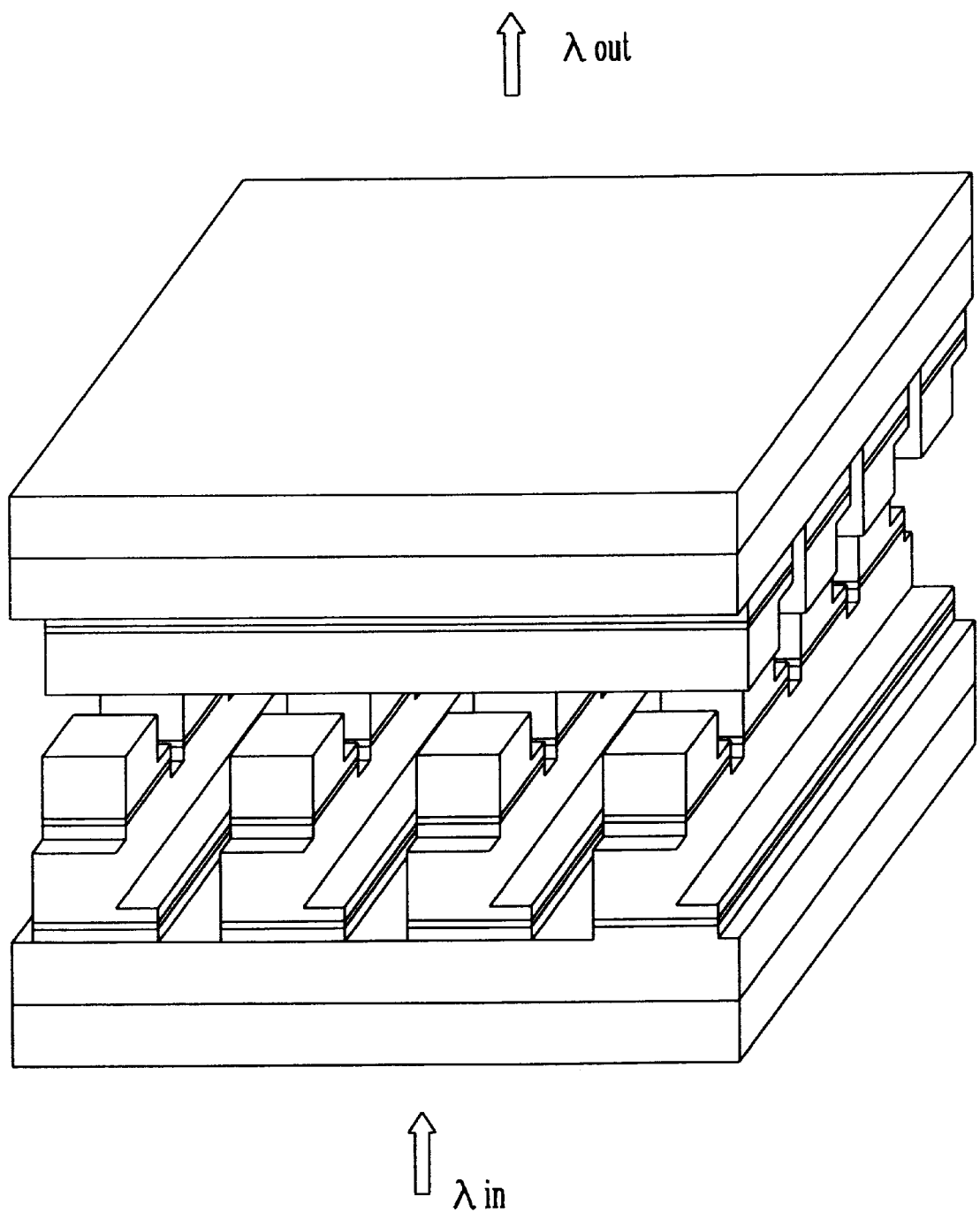
FIG. 4 shows a drawing to describe surface transmission-type optical switch of a 1-D array method according to the present invention.

FIG. 4, as a surface transmission-type optical switch of a 1-D array method according to the present invention, is a structure to cover the optical amplifier of FIG. 2 on the amplifier of FIG. 3. However, the third amplifier on the top is the shape that a substrate is reversed, and 3 amplifiers are arranged in serials. If all the signal beams which come in are amplified through 3 amplifiers connected in serials, the beams go out over a substrate on the top. As a result, difference of the third amplifier is to design so that the top mirror reflectance on the substrate may be smaller, compared with the reflectance of the lower mirror of the same amplifier. Also, the rectangular mesa surface of an amplifier on the second layer is turned as much as 90° so that it may be orthogonal to the mesa surface of an amplifier on the first layer. The laser beam which comes in, which transmits 2 amplifiers and is amplified, is amplified by the third same Fabry-perot resonance mode, by making the amplifier on the third layer operate under the current less than a critical value that self oscillation is possible. The beam amplified on the third layer is amplified by a rectangular shape along the square shape of the second 4×4 matrix amplifier and goes out over the substrate on the top.

Accordingly, it is designed so that continuous optical amplification of a Fabry-perot type may be possible through optical amplifiers three times. The switch is very similar to a surface-type laser structure and operates under the current less than a intrinsic oscillating critical value. The incoming signal wavelength for switching is designed to be the same with the resonance cycle of an optical amplifier, and so that amplifiers of serial connection on 3 layers can perform independent switching for incoming optical signals. The epi structure is designed to be simple so that it may reduce grown frequencies, as possible. An active layer which operates under the current less than a threshold value is designed by a quantum-well structure so that large optical amplification may be generated for incoming beams with small optical strength. Though shapes of incoming beams are circular, optical amplification of relatively large rectangles or circles shall be possible.

Additionally, the optical switch element according to the present invention is a structure to fold 3 optical amplifier layers of a Fabry-perot type, and the thin film structure of an optical amplifier is similar to a surface luminescence laser structure. As shown in FIG. 1, the surface transmission-type optical switch of the 1.55 micron band has the epi structure to grow a multilayer thin film layer of InAlGaAs system on a undoped InP substrate, and the amplification wavelength band of the 1.55 micron band is a very narrow fabry-perot type. Basic structure of an optical amplifier comprises 2 superlattice DBRs and an active layer with resonance layer thickness which can generate only one resonance mode the same with an incoming wavelength. An active layer by a multilayer quantum-well structure can heighten quantum efficiency and improves electronic constraint.

Reflectance of the lower mirror shall be 1, and the top mirror is a little lower than the lower mirror. By the arrangement the incoming beam from the lower part of a substrate goes out to the upper side of an epi layer after being transmitted through the InP substrate and amplified through optical amplifiers. The top mirror is a rectangular type by mesa etching, and current may apply to the diode structure, by exposing the n-type layer and the p-type layer by etching, and adding a metal thin film for ohmic contact. As shown in FIG. 2, 4 optical amplifiers of rectangular mesa shape are manufactured the same on the InP substrate, and arrangement is possible as shown in FIG. 1a so that individual amplification may be possible. As the incoming signal beam size over optical fibers is expected, as a circular type, that its diameter will be 10 microns or less, length of the short axis on a rectangular mesa surface is within 10 microns as the same. The length of a long axis is different depending on the size of a optical switch matrix. As operating current is adjusted to less than a intrinsic oscillation critical current, the Fabry-perot resonance mode of a single frequency the same with the wavelength by incoming laser signal beams, and gains are generated in the resonance layer and the quantum-well structure.

Out-beams amplified by incoming beams are generated as a shape of rings around the mesa etching surface of a rectangle at the very time to start amplification, but the area of out-beams widens gradually to the center of a rectangle as time passes. This means that the injection current gathers mainly on the edges of a rectangle by mesa, occurs from edges first at the instant of amplification and then gradually to the center by carrier diffusion. Characteristics of a surface transmission-type amplifier are to reduce the gain bandwidth by a resonance mode to less than 5 nm. The shape of out-beams depends significantly on operating current and mesa shapes.

Therefore, a circular incoming beam by optical fibers can be amplified and come out as a rectangular shape in the first amplifier. The amplified rectangular laser beam is amplified again as a square shape, passing through the second 4×4 array-type amplifier. As shown in FIG. 3, it is designed that all 16 matrix amplifier elements can operate individually, by putting 4 individual elements second on one amplifier of the first rectangular shape. The thin film structure of matrix elements and ohmic connection is the same with the structure of FIG. 1. All operation composition is that driving of matrix elements on the second layer is possible only when amplifier operation on the first layer is performed. And, though the amplifier on the first layer operates, it is possible to control that matrix elements on the second layer, on the amplifier, may be amplified or not individually. Then, reverse and put another optical amplifier on the third layer so that its substrate may be toward upside (See FIG. 4).

The third optical amplifier is rectangular, and its structure and process method is the same as shown in FIG. 2, but reflectance of the upper mirror is lower than the lower mirror so that signal beams may pass amplifiers only through one side direction. The rectangular structure of the amplifier on the third layer is the type to turn 90 degrees on the basis of the amplifier on the first layer. If one amplifier, among 16 matrix elements on the second layer, operates, the amplifier on the third layer which overlaps up and down with the amplifier on the second layer may operate consequently. Then, amplified beam shape is rectangular, and its operating principles are the same with the description for the amplifier on the first layer. Though each different signal beam of 2 or more elements, among 4 matrix elements on the second layer, arranged under the rectangular mesa of the third amplifier, is amplified and comes in to the third layer at the same time, signals of the rectangular amplifier on the third layer are amplified and out at the state that its signals are overlapped. Such optical function that 2 or more different beams are overlapped may be utilized for operation processing.

An optical switch, as a matrix type, is more efficient if n value is larger. Its structure shall be simple and size shall be small. For such requirements, a surface transmission-type optical switch of a space division multiplex can meet such requirements enough and can be utilized for WDM, TDM and optical computers. Its configuration is 3 optical amplifiers of 3 different Fabry-perot type and of serial connection by overlaping 3 layers. Though n value increases, the number of layers does not change. Though an incoming optical signal has multiple wavelengths, the switch can select and amplify only the optical signals with a kind of wavelengths (role of optical filtering) and can perform switching the selected signal beams. The gain bandwidth of an amplifier is not more than 5 nm, and it is possible to change a central wavelength of a band by controlling operating temperature. The variable wavelength of an optical filter is expected to be change of 0.2 nm per 1 K. As the result, individual elements of a matrix optical switch for incoming beams with multiple wavelength signals select only a kind of wavelengths and let it pass. The beams are out only when matrix location exchanges or is transferred.

As described above, the present invention can apply to the wavelength division multiplex and the time division multiplex as well as to the next generation parallel-type free space division multiplex. Its application scope is various as the present invention may be utilized as an optical operation processing element for parallel-type free computers. Generally, a matrix optical switch, as its transfer direction for signal beams is a side face type in parallel with a thin film layer, known until now requires an optical waveguide, and also needs a delicate and exact structure and complicated process. However, the core element of the present invention is the surface transmission type which does not need optical waveguides at all. Its process is easy because a creation method of the thin film structure is simple and a geometrical configuration of matrix elements is simple. In case of a side switch, if n value of the n×n matrix is larger, loss by an optical waveguide is very large as the length of an optical wavelength becomes longer geometrically. To compensate the loss, more optical amplifiers are needed on an optical waveguide, coupling efficiency between optical element may be lowered and size of a matrix element shall be large inevitably. On the contrary, optical loss of the surface transmission-type switch applied in the present invention is small uniformly thanks to fixed optical amplification 3 times and unnecessary optical waveguides, though n value increases. And small element size is possible. As a result, the surface transmission type may be utilized the most for the matrix that n value is large, and particularly production cost is very cheap relatively.

Also, process manufacturing of the present invention, as a structure not to need epi growth and optical waveguides without regrowing, is simple, and optical features can be easily expected before process. And efficient connection of optical fibers arranged by the 1-D method is also simple. In addition to optical loss by optical waveguides, total optical loss is very small, considering optical connection efficiency with an optical switch, and a stable wavelength may be kept. Though n value of a matrix increases, entire element area of an optical element may be kept by the rate of n×n as a square. As a result, thanks to simple thin film growing, manufacturing process and feature analysis technology, reproduction efficiency is high and production cost is very cheap.

While the present invention has been described and illustrated herein with reference to the preferred embodiment thereof, it will be understood by those skilled in the art that various changes in form and details may be made therein without departing from the spirit and scope of the invention.

What is claimed is:

1. A surface transmission-type optical switch of a one-dimensional array, comprising:
   an indium substrate to which incoming beams are transmitted; and a Fabry-perot type optical amplifier which is made of a lower superlattice Distributed Bragg Reflector (DBR) whose reflectance is 1, an active layer of resonance layer thickness which can generate only one resonance mode corresponding to an incoming wavelength, and a top superlattice DBR which has a rectangular or oval mesa surface of different shape and size compared with a circular incoming beam, wherein:
   signals reflect from the surface and are amplified and output if optical signals come in from a lower part of said indium substrate; and
   the switch acts as both an optical amplifier and an optical filter by independent switching of multiple matrixes of a space division multiplex, by overlapping said optical amplifiers of uniform shape serially, using said surface-type optical amplification, which can control filter wavelengths.

2. A surface transmission-type optical switch of a one-dimensional array, comprising;
   an indium substrate to which incoming beams are transmitted; and a Fabry-perot type optical amplifier which is made of a lower superlattice Distributed Bragg Reflector (DBR) whose reflectance is 1, an active layer of resonance layer thickness which can generate only one resonance mode corresponding to an incoming wavelength, and a top superlattice DBR which has a rectangular or oval mesa surface of different shape and size compared with a circular incoming beam, wherein:

signals reflect from the surface and are amplified and output if optical signals come in from a lower part of said indium substrate; and said active layer is a structure of a resonance transmission multilayer quantum-well with 3 to 9 InAlAs barrier layers 2.5 nm thick, and InGaAs quantum-well layers 9.0 nm thick.

3. A surface transmission-type optical switch having an indium substrate and an optical amplifier, in which the optical amplifier comprising:

a first lower DBR layer having pairs of InAlAs layer and InGaAs layer formed on said indium substrate;

a second lower DBR layer having a pair of InAlAs layer and InGaAs layer formed on said first lower DBR layer, wherein said second lower DBR layer is doped as n-type impurities;

a undoped active layer formed on said second lower DBR, wherein said undoped active layer has a structure of a resonance transmission quantum-well mulitlayer consisting of a plurality of InAlAs barrier layers having thickness of 2.5 nm and InGaAs quantum-well layers having thickness of 9.0 nm;

a first top DBR layer having a pair of InAlAs layer and InGaAs formed on said undoped active layer, wherein said first top DBR layer is doped as p-type; and an second top DBR layer having pairs of InAlAs layer and InGaAs layer formed on said first top DBR layer, wherein said second top DBR layer having rectangular or oval mesa.

4. A surface transmission-type optical switch having an indium substrate and an optical amplifier as claimed in claim 3, wherein a plurality of said optical amplifier are formed on said indium substrate in the form of matrix, so that both functions of an optical amplifier and an optical filter is obtained by switching said optical amplifier.

* * * * *